United States Patent [19]

Busta

[11] Patent Number: 4,744,246
[45] Date of Patent: May 17, 1988

[54] FLOW SENSOR ON INSULATOR

[76] Inventor: Heinz H. Busta, 223 N. Home, Park Ridge, Ill. 60068

[21] Appl. No.: 857,986

[22] Filed: May 1, 1986

[51] Int. Cl.$^4$ .............................................. G01F 1/68
[52] U.S. Cl. .................................................... 73/204
[58] Field of Search ........................................ 73/204

[56] References Cited

U.S. PATENT DOCUMENTS

| 1,996,943 | 4/1935 | Wile | 73/204 |
| 3,802,264 | 4/1974 | Poppendiek et al. | 73/204 |
| 4,283,944 | 8/1981 | Gruner et al. | 73/204 |
| 4,399,697 | 8/1983 | Kohama et al. | 73/204 |
| 4,478,077 | 10/1984 | Bohrer et al. | 73/204 |
| 4,587,843 | 5/1986 | Tokura et al. | 73/204 |

FOREIGN PATENT DOCUMENTS 0081516  5/1984  Japan ..................................... 73/204

Primary Examiner—Herbert Goldstein

[57] ABSTRACT

A flow sensor on a thermally insulating substrate is provided with improved thermal conductance and ruggedness to hostile environments. The flow sensor includes a pn junction temperature sensing element on the substrate, a layer of dielectric material, which provides electric isolation and physical protection, covering the pn junction element, and a thin film heating element covering the dielectric layer and being in close thermal contact with the pn junction element.

23 Claims, 5 Drawing Sheets

FLOW SENSOR ON INSULATOR

BACKGROUND OF THE INVENTION

The present invention relates to the field of velocity or flow sensors. Fluid and gas velocity sensors that are commercially available are commonly of the single hot wire, hot film, or thermistor type and are mounted on the end of a probe which is inserted into the fluid stream. A detailed description of the operation and construction of the hot wire and hot film anemometers is given, for example, by E. Nelson, "Hot Wire and Hot Film Anemometry," Sensors, Sept. 1984, pp. 17–22. In principle, the thin wire or filament is heated to a given temperature by passing a current through the element. As the fluid velocity changes, the magnitude of heat transfer from the element to the fluid changes through convection and conduction which changes the temperature of the sensing element. The temperature change and associated change in electrical resistance caused by the cooling effect of the fluid flow is a measure of the fluid velocity. For maximum sensitivity, the product of temperature coefficient of resistance (TCR) and resistivity of the hot wire element must be large. A number of wire materials are adequate in this respect and are readily available in fine wire form. These include platinum, tungsten, nickel, and an alloy consisting of 80% platinum and 20% iridium. The TCR times resistivity products for these materials are 320, 250, 480, and $240 \times 10^{-10}$ ohm-cm/°C., respectively. (H. P. Grant and R. E. Kronaner, "Fundamentals of Hot Wire Anemometry," Symposium on Measurement in Unsteady Flow, American Society of Mechanical Eng., p. 44 (1962)). Other considerations for choosing the wire material include impact strength and gas temperature range, ease of mounting and welding, ease of cleaning, and specific factors such as freedom from catalytic surface properties.

In recent years, for many applications, the basic hot wire anemometer has been replaced by a hot thin film anemometer with film thickness being approximately 1000 Angstroms. Advantages of the thin film anemometer over the hot wire anemometer are improved frequency response, lower end loss of heat resulting in shorter sensing length, more flexible configuration (i.e., flat, wedge, conical), and less susceptibility to fouling. A thin quartz ($SiO_2$) coating on the surface resists accumulation of foreign material. One major drawback of the thin film anemometer flow sensor is that it is relatively large in size and must be manufactured individually (which makes costs expensive). Several attempts to improve the thin film anemometer flow sensor have been made. These improvements have centered around the micromachining techniques used in integrated circuit manufacturing. A typical example is given by Higashi et al., U.S. Pat. No. 4,501,144. Higashi teaches a sensor which includes a pair of thin film resistors located on a thermally isolated bridge across a well that has been micromachined in a monocrystalline silicon substrate. Equi-distant between the resistors is a thin film heating element that, under operation, is heated to a temperature of approximately 200° C. via $I^2R$ heating. At zero fluid flow, the two resistor elements are heated to the same temperature and thus exhibit the same resistance. Under flow conditions, the upstream element is cooled by the incoming fluid to a temperature which is proportional to the fluid velocity. The downstream element is cooled by a lesser degree since the fluid has been heated by the upstream sensing element and by the heating element during its travel. Thus, the resistance change of the upstream element is larger than that compared to the downstream element. The difference of the two resistor readings, which can be converted to a voltage signal via on-chip or external circuitry, is a measure of flow velocity. By using batch processing techniques, several hundred of these sensors can be processed on a single silicon wafer. After dicing the wafers into appropriate chips, the individual sensing elements are then packaged and wire bonded to make the appropriate connections to the external circuitry. While Higashi offers improved performance in the area of reduced power consumption, the thin diaphragm structure is susceptible to fouling and breakage in hostile environments. And, while measuring the temperature difference of the two sensors eliminates the effects of thermal aging, the distance of the sensors from the heater reduces thermal conductance.

Huijsing et al (J. H. Huijsing, J. P. Schuddemat, and W. Verhoef, "Monolithic Integrated Direction-Sensitive Flow Sensor," IEEE Transactions on Electron Devices, Vol. ED-29, No. 1, pp. 133–136, January, 1982) disclose a flow sensor comprising a silicon chip with an identical diffused transistor temperature sensing element embedded near each upstream and downstream edge of the chip and a centrally located diffused transistor heater element to raise the chip to as much as 45 degrees Centigrade above the air stream temperature. The upstream sensing element is cooled slightly more than the downstream sensing element under air flow conditions, and the temperature difference between the two sensor element transistors results in an electrical current difference between them, which when converted to a voltage difference is a measure of the air flow. The sensor elements must be located on opposite sides of the chip to achieve an appreciable temperature difference between them, and even so, in the air flow range up to 1000 feet per minute, the temperature differences are small, range from 0 to under 0.2 degrees Centigrade.

Van Putten et al (A. F. P. Van Putten and S. Middlehoek, "Integrated Silicon Anomometer," *Electronics Letters*, Vol. 10, No. 21 October, 1974, pp. 425–426) disclose a silicon chip with an identical diffused resistor element embedded on each of four opposite sides of a chip. All resistor elements are self heated, thus raising the chip and its support substantially above the ambient air stream temperature. The resistors are operated in an electrical double bridge circuit. Under zero air flow, all elements are at the same temperature, and the double bridge is electrically balanced. Under air flow conditions, the upstream and downstream elements which are normal to the flow are cooled more than the side elements which are parallel to the flow. This temperature difference unbalances the electrical double bridge to give a measure of the air flow velocity.

The foregoing attempts improve the state of the art in some respects, but remain deficient with respect to many characteristics desired such as ruggedness. Therefore, it is an object of the present invention to provide a flow sensor having improved ruggedness to hostile environments.

It is another object of the present invention to provide a flow sensor having low power consumption and good thermal conductance.

It is yet another object of the present invention to provide a flow sensor that can be easily manufactured using conventional micromachining techniques.

It is another object of the present invention to provide a flow sensor whose active sensing elements are located on a thermally isolated substrate which minimizes energy consumption during operation.

These and other objects and advantages of the invention, as well as the details of the illustrative embodiments, will be more fully understood from the following description and the drawings.

SUMMARY OF THE INVENTION

To achieve the foregoing and other objects and in accordance with the purposes of the present invention, a flow sensor may comprise a thermally insulating substrate; a temperature sensing element disposed on the substrate; and a heating element in close thermal contact with and electrically isolated from the temperature sensing element. Preferably the heating element is disposed on the temperature sensing element with an insulating (dielectric) layer between. A preferred temperature sensing element is a pn junction in which the forward voltage of the pn junction is monitored upon temperature change of the heating element. The close proximity of the heating element provides significantly improved thermal conductance over prior art flow sensors which having a heating element disposed between two temperature sensors. In addition, the structure of the flow sensor of the present invention provides two layers of protection to the pn junction sensor from hostile environments: the dielectric insulating layer and the thin film heating element.

In operation, the flow sensor is placed in a flowing medium. The pn junction temperature sensor is heated to a temperature above the ambient by the heating element causing a certain forward voltage drop at a given constant pn junction current and fluid flow rate. When the fluid flows past the sensor, heat is removed from the sensor which causes the forward voltage of the pn junction to change. The change in forward voltage of the pn junction is a measure of fluid velocity.

BRIEF DESCRIPTION OF THE DRAWINGS

The present invention is illustrated in the accompanying drawings wherein.

DETAILED DESCRIPTION OF THE INVENTION

Figure 1:
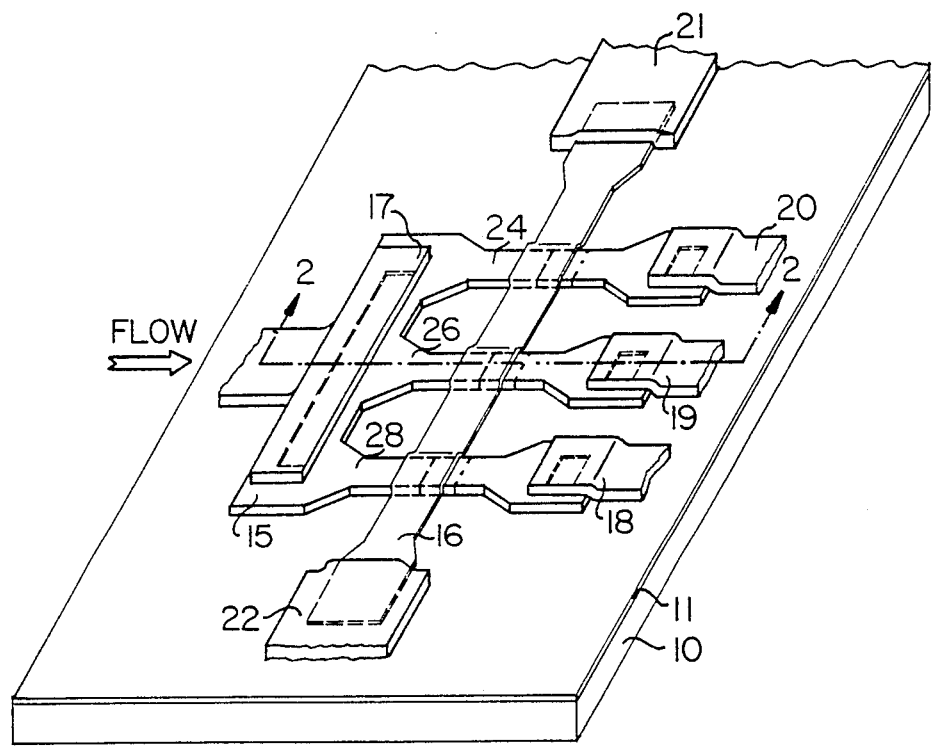
FIGS. 1 and 2 are perspective and cross-sectional views, respectively, of a flow sensor having three pn junction sensors.
Figure 2:
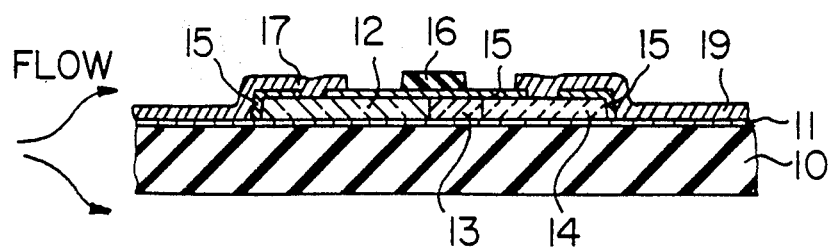

Referring to FIGS. 1 and 2, a flow sensor according to the present invention is shown. In this embodiment, the sensor includes three identical pn junction temperature sensors 24, 26, and 28, which are electrically isolated from heating element 16 by dielectric layer 15. In this embodiment the pn junctions are formed as $p^+n$ junctions and are deposited on a thermally insulating substrate of quartz ($SiO_2$). Alternatively, the pn junctions could be formed as $n^+p$ junctions. Since the $p^+n$ junctions are formed of laser-recrystallized polycrystalline silicon, a thin layer 11 of silicon nitride ($Si_3N_4$) has been deposited on substrate 10. The $Si_3N_4$ acts as a wetting agent during laser-recrystallization of the polycrystalline silicon. The $p^+n$ junctions are formed of common $p^+$ region 12, three n regions 13 and three $n^+$ regions 14.

The flow sensor of FIGS. 1 and 2 is typically made in accordance with the following steps. After layer 11 is deposited on substrate 10, a layer of undoped polycrystalline silicon is deposited over the entire substrate. Regions 24, 26, and 28 are defined via photolithographical techniques, delineated and encapsulated with a layer of silicon dioxide having a thickness of the order of approximately 5000 Angstroms. This layer, which is not shown in the figures, acts as an encapsulant. The structure is then laser-recrystallized, preferably using a continuous wave argon ion laser, to enlarge the grains of the polycrystalline silicon to form near monocrystalline silicon which has the appropriate properties to allow formation of extremely stable, reproducible electronic devices. Typical laser-recrystallization parameters are: 7 watt laser power, a scan speed of 1 cm/second, a substrate temperature of 500 degrees Centigrade, a spot size of 20 micrometers and a beam step size of 15 micrometers. After crystallization, the cap oxide is removed and the structure is doped, preferably by ion implantation, to become lightly n type with a concentration in the range from $10^{14}$ to $5 \times 10^{16}$ donors/$cm^3$. Region 12 as outlined in FIGS. 1 and 2 is then defined and doped with boron to form a heavily $p^+$ doped, i.e. $10^{18}-10^{20}$ acceptors/$cm^3$, region. Regions 14 are then defined in a similar manner using photolithographical techniques and doped, preferably via ion implantation to form heavily $n^+$ doped, i.e. $10^{17}-10^{19}$ donors/$cm^3$, regions. The purpose of the $n^+$ regions 14 is to reduce the series resistance of the lateral $p^+n$ junctions. A thin layer of insulator 15, preferably silicon dioxide or silicon nitride, is then deposited or grown to a thickness typically ranging from 1000–3000 Angstroms over the entire area. On top of layer 15, the heating element 16 is formed and preferably aligned in such a fashion as to be centered over the metallurgical junction which is formed between the $p^+$ regions 12 and the n regions 13.

Heating element 16 can be formed of a heavily doped $n^+$ or $p^+$ polycrystalline layer deposited conformally over the insulated, laser-recrystallized temperature sensors 24, 26, and 28. Other suitable materials include tantalum nitride, nickel-chrome, and refractory metal silicides. To form the metallization contacts, four contact openings are defined to contact regions 12 and 14 and the insulating layer 15 is removed in these regions. The entire substrate is then coated with a contact metal, preferably a layer of approximately 10,000 Angstroms of aluminum or an aluminum-silicon or aluminum-copper copper alloy, to form contacts 21 and 22 for heating element 16, and 17 and 18, 19, 20 for sensors 28, 26, 24, respectively.

The operation of the present invention in sensing gas or liquid flow can be described with reference to FIGS. 1 and 2. A constant current or voltage is supplied to the heater terminals 21 and 22 to heat element 16 by 50 to 150 degrees Centigrade above ambient. The elevated temperature is sensed by the three laser-recrystallized $p^+n$ junctions. A constant current, of the order of 30 microamperes, is imposed on each of the three junctions with a polarity so that they operate in the forward direction. This then results in a forward voltage signal which is linearly proportional to the temperature at the metallurgical junction. These forward voltages are then measured at terminals 17 and 18, 17 and 19, and 17 and 20, respectively. In this embodiment, three temperature sensors are shown. However, only one of the terminals, i.e., 17 and 19 can also be used for flow measurements. The others act as redundancy elements which can be used for averaging purposes to obtain a more accurate reading or as back-up sensors in case of failure or unforeseen drift of the primary designated sensor.

Figure 3:
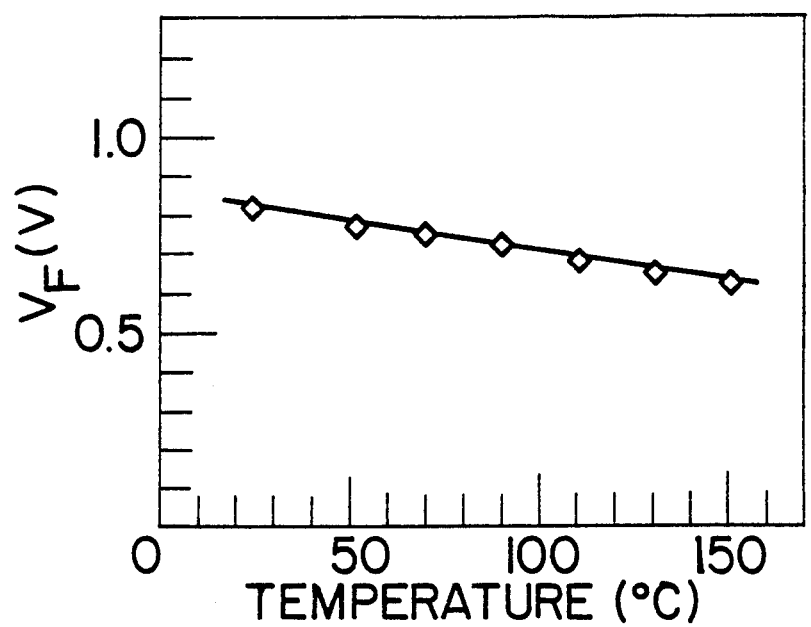
FIG. 3 is a graph of output voltage versus junction temperature for the flow sensor of FIGS. 1 and 2.

FIG. 3 shows a graph of the typical forward voltage $V_F$ measured at a forward current of 30 microamperes, at terminals 17 and 20, as a function of temperature for a sensor processed according to FIGS. 1 and 2. The widths of the heating element 16 and the lateral $p^+n$ junctions were typically 25 micrometers. From the slope of this curve, a diode sensitivity of 1.44 millivolts per degree Centigrade is obtained. This means, that under flow operation, where the passing gas or fluid cools the heating element, for every degree Centigrade drop in the junction temperature, a forward voltage change of 1.44 millivolts is obtained.

Figure 4:
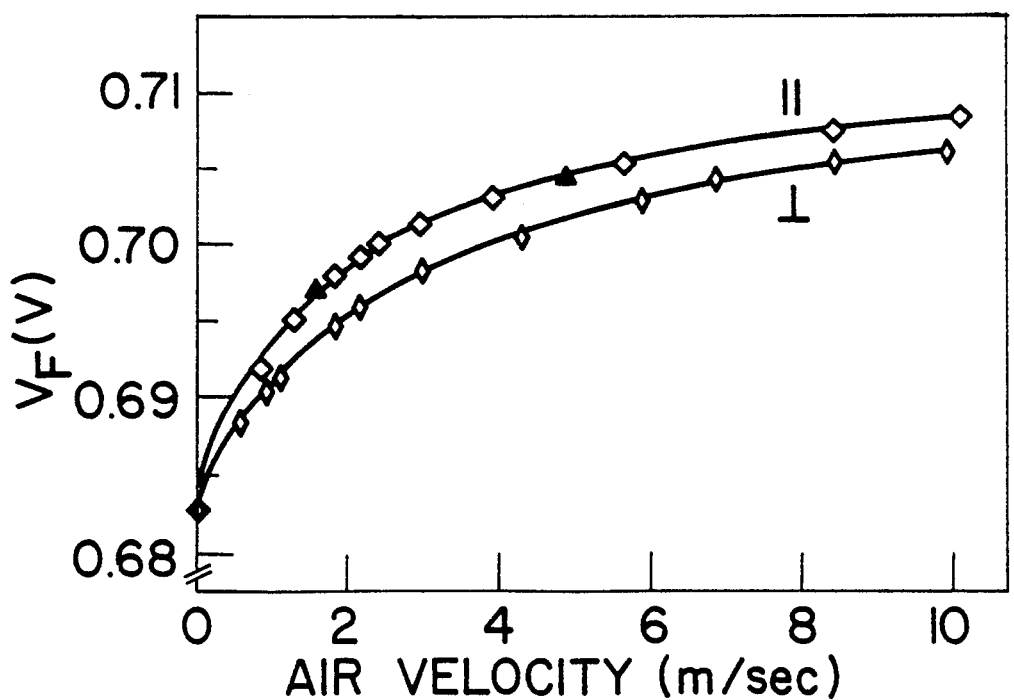
FIG. 4 is a graph of output voltage versus velocity for the flow sensor of FIGS. 1 and 2.

FIG. 4 is a graph of the forward voltage of the sensor of FIGS. 1 and 2 versus velocity under actual air flow conditions. The heating element 16 was energized to 50 degrees Centigrade under constant voltage operation, and the voltage was measured at a diode current of 30 microamperes between terminals 17 and 20. The flow sensor which was formed on a chip with dimensions of 1.0 millimeter by 1.8 millimeter was mounted on a TO metal header and subjected to the flow parallel to the surface of the sensor and perpendicular to it.

Figure 5:
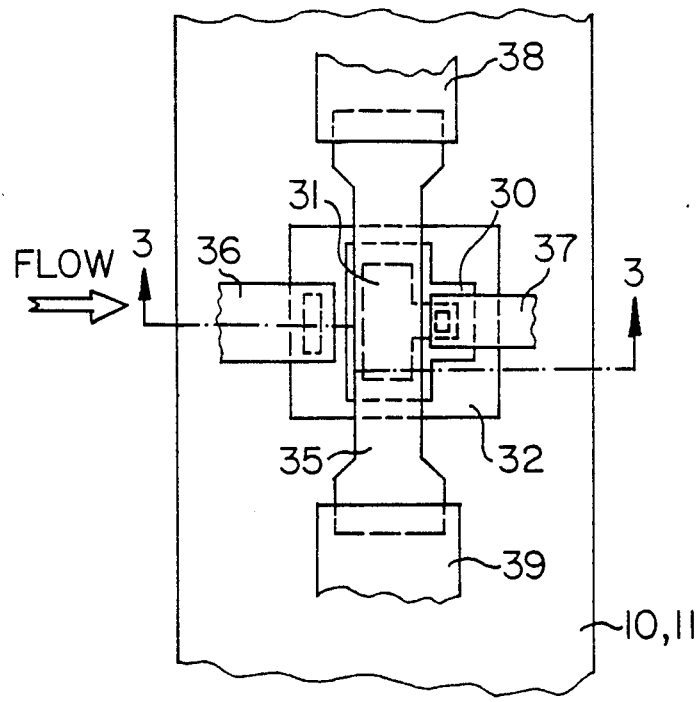
FIGS. 5 and 6 are top and cross-sectional views of a flow sensor having a single pn junction sensor.
Figure 6:
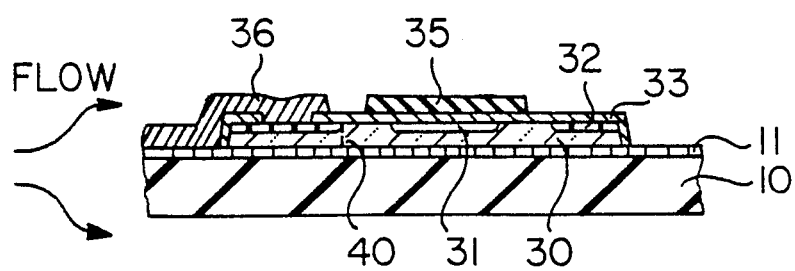

FIGS. 5 and 6 shows an alternative embodiment of the present invention in which a single $p^+n$ junction is formed. In FIG. 5, the $p^+n$ junction is formed along the boundary between region 31, which is $p^+$ doped, and region 30, which is n doped. Heating element 35 crosses the metallurgical junction but is separated from it by an insulating layer 33. To avoid excessive series resistance, region 32 is $n^+$ doped. Contact to the $p^+n$ junction is made via the metallization 36 and 37, respectively. Heating element 35 is contacted at regions 38 and 39. The substrate is the same as in FIGS. 1 and 2 and is shown as region 10 which is preferably quartz. If the $p^+n$ junction is fabricated in laser-recrystallized silicon, a silicon nitride layer 11 is recommended to aid the wetting process during recrystallization. The dashed line 40 indicates that the doping profiles or regions 31 and 32 can extend to region 11.

The $p^+n$ junction sensors in FIGS. 1, 2, 5 and 6 can also be fabricated by other means and using other than silicon semiconductors. Examples include polycrystalline and amorphous silicon or monocrystalline silicon deposited on insulator by means other than laser-recrystallization. Other suitable semiconductors include SiC, GaAs, Ge, etc.

Figure 7:
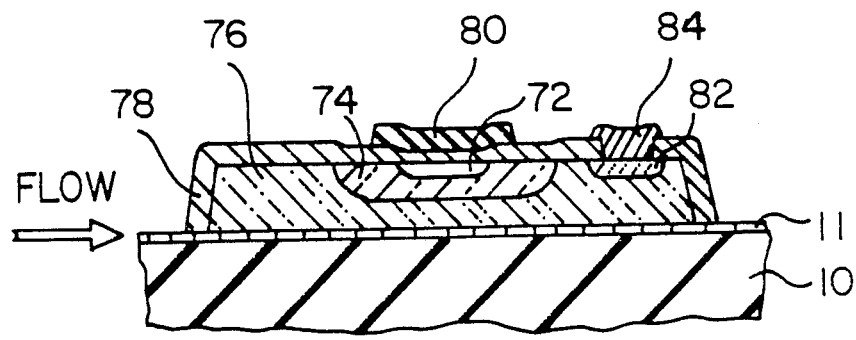
FIG. 7 is a cross-sectional view of a flow sensor in which the temperature sensing element is a bipolar transistor.

In addition, bipolar transistor structures of the type pnp or npn can be used for the temperature sensing elements. FIG. 7 shows an embodiment in accordance with the present invention where the temperature sensing element is a bipolar transistor. Here, a vertical npn transistor is formed in laser-recrystallized polycrystalline silicon on substrate layers 10 and 11. It consists of the $n^+$ emitter region 72, the p base region 74 and the n collector region 76. The structure is covered by an insulating layer 78 on top of which the heating element 80 is placed. Not shown in FIG. 7 are the contacts to the base 74 and emitter 72. Contact to the collector 76 is made via an $n^+$ region 82 and a metal contact 84. One mode of operation would be to sense the forward voltage of the emitter-base junction (72-74) in accordance with the previous discussed embodiments.

Figure 8:
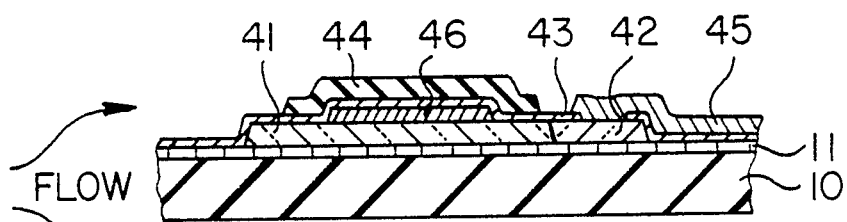
FIG. 8 is a cross-sectional view of a flow sensor in which the temperature sensing element is a Schottky barrier structure.

FIG. 8 shows an embodiment in accordance with the present invention where the temperature sensing element is a Schottky diode, i.e. a metal-to-semiconductor contact. A laser-recrystallized or polycrystalline silicon region 41, which is n doped is contacted by the Schottky barrier metal or metal silicde 46. Here, Pt, Ti, Ni, Al, etc. form good, low leakage barriers to n silicon. To provide good ohmic contact, an $n^+$ doped region 42 is formed in region 41. The Schottky barrier structure is covered by an insulator 43 on top of which the heater element 44 is placed. Contact to the $n^+$ region is made via metallization 45. Similar contacts, not shown in FIG. 8, are made to metal 46 and to the heater element 44 in accordance with the previously described embodiments. The substrate shown here is quartz layer 10 with optional silicon nitride layer 11.

Figure 9:
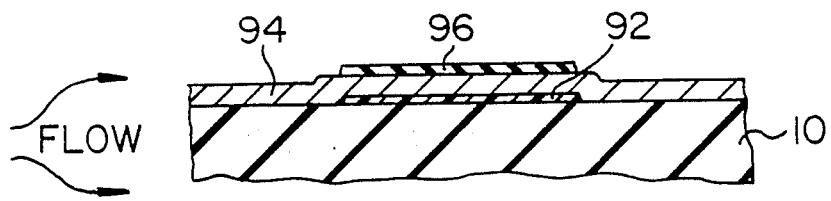
FIG. 9 is a cross-sectional view of a flow sensor in which the temperature sensing element is a thin film resistor.

FIG. 9 shows an embodiment in accordance with the present invention where the temperature sensing element is a thin film resistor. Here, a thin film resistor 92 is deposited on insulating substrate 10. The thin film resistor can be deposited in accordance with the teachings of Higashi et al or other micromachining techniques. Thin film resistor 92 is coated with dielectric layer 94, on top of which is deposited heating element 96. Contacts to heating element 96 and resistor 92 are not shown.

Figure 10:
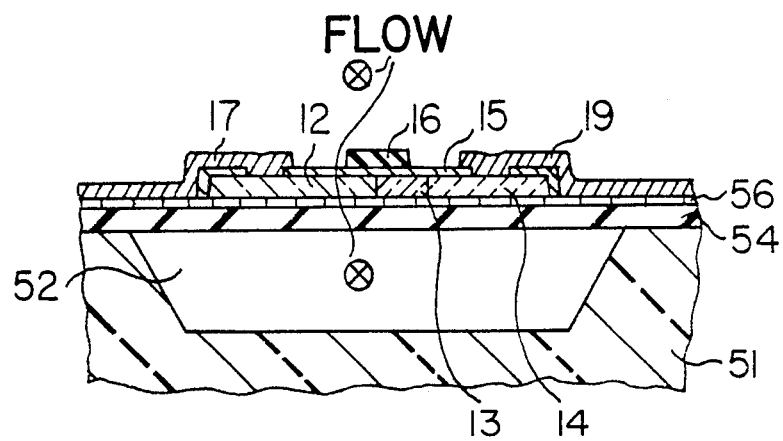
FIG. 10 is a cross-sectional view of a flow sensor having a single pn junction over a well in the substrate.

FIG. 10 shows an embodiment in accordance with the present invention where the flow sensor is fabricated on substrate layers 54 and 56 which in turn rest on a silicon wafer 51 into which a well or depression 52 is formed. Well 52 may be fabricated according to the method described in Higashi, U.S. Pat. No. 4,501,144, and also in the general literature on micromachining. All of the above sensor embodiments as shown in FIGS. 1, 2 and 5-9 as well as FIG. 11 can be fabricated on such a well. Typically the thickness of layer 54 would range from 1 to 5 micrometers. The purpose of this embodiment is to fabricate a sensor element that uses minimum power to energize the heating element to a given temperature and that exhibits an extremely fast response to a change in flow. This is accomplished by minimizing the thermal mass in the vicinity of the sensor and by bringing the medium flow in close contact at the top and the bottom of the sensing element.

Figure 11:
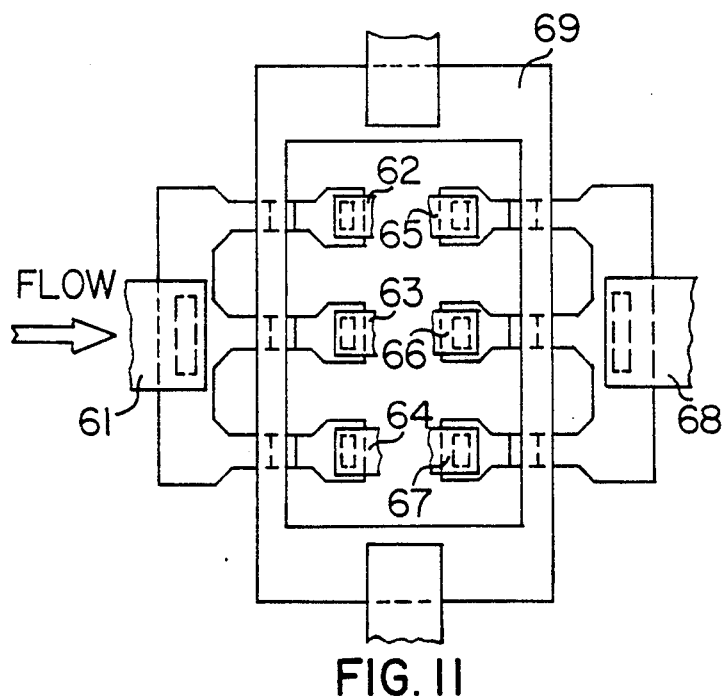
FIG. 11 is a plan view of a flow sensor having two pn junction sensor/heater structures.

FIG. 11 shows an embodiment where two sensor structures similar to the one shown in FIG. 1 are joined by a common heater 69. Alternatively, two separate heating elements can be provided, one for each set of junction sensors. As the fluid flows over the upstream junctions 62, 63, 64, the left side of the heater element will be cooled by a given amount which is proportional to the flow rate. This results in a voltage signal that can be obtained at terminals 61 and 62, 61 and 63, and at 61 and 64. As the fluid reaches the downstream junctions 65, 66, 67, the amount of cooling of these junctions will be less, since the flowing fluid was heated by the upstream heater element. Thus, the voltage change that can be measured at terminals 68 and 65, 68 and 66, and at 68 and 67 will be less than in the upstream case. This then results in a difference signal between terminals 62 and 65, 63 and 66, and 64 and 67 which is proportional to the velocity of the flowing medium. Directionality of flow can also be monitored across different terminals. The advantages of this embodiment over the embodiment shown in FIG. 1 is that aging affects of the heating element 69 over time, which might result in a change of its resistance, are compensated since the difference of two cooling effects are measured and not the absolute value. As noted above, a separate heating element can also be provided for the upstream sensors and the downstream sensor. Aging will affect both heaters equally. If the resistance of the heating element 16 in FIG. 1 changes with time, the unit would end to drift since the temperature of the heating element would change for a given flow velocity and constant heater excitation. To overcome this problem, preaging of the resistor element in an annealing furnace at an elevated temperature can be preformed.

The heating elements can be manufactured using materials with a high or low temperature coefficient of resistance (TCR). For a low TCR the resistance of the heater would not change very much under operation, thus providing almost constant power $V^2/R$ or $I^2R$ to the heating element. In the embodiment of the present invention according to FIG. 1 and the data shown in FIG. 4, the TCR of the boron-doped polycrystalline silicon heater element was $+840$ parts per million per degree Centigrade (ppm/°C.). For the TaN heater element in a similar embodiment it was $-100$ ppm/°C. On the other hand, if materials such as NiCr, W, etc. Are being used, TCRs of 2000 to 6000 ppm/°C. can be obtained. As the fluid flow increases from low to high, the heating element is being cooled which results in a reduction in resistance. For constant voltage operation this results in an increased power to the heating element via $V^2/R$ which raises the temperature and thus reduces the sensitivity of operation. In addition to the flow sensing in accordance with the present invention, a high TCR heating element can, in principle, be used as a second flow sensor on the same chip. This can be accomplished by monitoring the resistance of heater 16 in accordance with FIG. 1 between terminals 21 and 22.

Although the invention has been described and illustrated in detail, it is to be clearly understood that the same is by way of illustration and example only, and is not to be taken by way of limitation; the spirit and scope of this invention being limited only by the terms of the appended claims.

The embodiments of the invention in which an exclusive property or right is claimed are defined as follows:

1. A flow sensor comprising:
   a thermally insulating substrate;
   a temperature sensing element disposed on said substrate; and
   a thin film heating element disposed on said temperature sensing element and being in close thermal contact with and electrically isolated from said temperature sensing element;
   wherein said temperature sensing element includes a pn junction having a p-doped region and a n-doped region positioned laterally on said substrate and a junction between the p-doped and the n-doped regions; and
   wherein said heating element is positioned over said junction.

2. The flow sensor of claim 1 wherein a thin film dielectric layer is interposed between said heating element and said temperature sensing element.

3. The flow sensor of claim 1 wherein said substrate is formed of quartz.

4. The flow sensor of claim 1 wherien said temperature sensing element is formed of a material selected from the group consisting of polycrystalline silicon, amorphous silicon, single crystal silicon, and laser-recrystallized polycrystalline silicon.

5. The flow sensor of claim 2 wherein said heating element is centered over said temperature sensing element.

6. The flow sensor of claim 2 wherein said insulating substrate comprises a thin film insulating member suspended across a depression in a substrate body.

7. The flow sensor of claim 2 wherein said heating element is formed of a material selected from the group consisting of silicon, tantalum nitride, nickel-chrome, and refractory metal silicides.

8. The flow sensor of claim 2 wherein said dielectric layer is formed of a material selected from the group consisting of silicon nitride and silicon dioxide.

9. A flow sensor comprising:
   a thermally insulating substrate;
   a plurality of temperature sensing elements disposed on said substrate and being spaced apart from one another; and
   a thin film heating element disposed on said temperature sensing elements and being in close thermal contact with and electrically isolated from each of said temperature sensing elements;
   wherein each of said temperature sensing elements includes a pn junction having a p-doped region and a n-doped region positioned laterally on the substrate and a junction between said p-doped and said n-doped regions; and
   wherein said heating element is positioned over said junction.

10. The flow sensor of claim 9 wherein a thin film dielectric layer is interposed between said heating element and each of said temperature sensing elements to provide electric isolation therebetween.

11. The flow sensor of claim 10 wherein said substrate is formed of quartz.

12. The flow sensor of claim 10 wherein each of said temperature sensing elements is formed of a material selected from the group consisting of polycrystalline silicon, amorphous silicon, laser-recrystallized polycrystalline silicon and single crystal silicon.

13. The flow sensor of claim 10 wherein said heating element is centered over each of said temperature sensing elements.

14. The flow sensor of claim 10 wherein said insulating substrate comprises a thin film insulating member suspended across a depression in a substrate body.

15. The flow sensor of claim 10 wherein said heating element is selected from the group consisting of silicon, tantalum nitride, nickel-chrome, and refractory metal silicides.

16. The flow sensor of claim 10 wherein said dielectric layer is formed of a material selected from the group consisting of silicon nitride and silicon dioxide.

17. A flow sensor comprising:
a thermally insulating substrate;
an upstream sensor disposed on said substrate; wherein said upstream sensor comprises a plurality of upstream temperature sensing elements spaced apart from one another; and
an upstream thin film heating element disposed on said upstream temperature sensing elements and being in close thermal contact with an electrically isolated from each of said upstream temperature sensing elements; and
a downstream sensor disposed on said substrate and spaced apart from said upstream sensor; wherein said downstream sensor comprises a plurality of downstream temperature sensing elements spaced apart from one another; and
a downstream thin film heating element disposed on said downstream temperature sensing elements and being in close thermal contact with and electrically isolated from each of said downstream sensing elements;
wherein each of said upstream and said downstream sensing elements includes a pn junction having a p-doped region and a n-doped region positioned laterally on said substrate and a junction between said p-doped and said n-doped regions; and
wherein each of said heating elements is positioned over its respective temperature sensing elements.

18. The flow sensor of claim 17 wherein a thin film dielectric layer is interposed between each of said heating elements and said respective temperature sensing elements to provide electric isolation therebetween.

19. The flow sensor of claim 18 wherein said substrate is formed of quartz.

20. The flow sensor of claim 19 wherein each of said temperature sensing elements is formed of a material selected from the group consisting of polycrystalline silicon, amorphous silicon, laser-recrystallized polycrystalline silicon and single crystal silicon.

21. The flow sensor of claim 20 wherein each of said dielectric layers is formed of a material selected from the group consisting of silicon nitride and silicon dioxide.

22. The flow sensor of claim 21 wherein each of said heating elements is selected from the group consisting of silicon, tantalum nitride, nickel chrome, and refractory metal silicides.

23. The flow sensor of claim 18 wherein said insulating substrate comprises a thin film insulating member suspended across a depression in a substrate body.

* * * * *